United States Patent
Cok et al.

(10) Patent No.: US 7,064,733 B2
(45) Date of Patent: Jun. 20, 2006

(54) FLAT-PANEL DISPLAY WITH LUMINANCE FEEDBACK

(75) Inventors: Ronald S. Cok, Rochester, NY (US); Ching W. Tang, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 485 days.

(21) Appl. No.: 10/639,562

(22) Filed: Aug. 12, 2003

(65) Prior Publication Data

US 2004/0032382 A1 Feb. 19, 2004

Related U.S. Application Data

(63) Continuation of application No. 09/675,346, filed on Sep. 29, 2000.

(51) Int. Cl.
*G09G 3/30* (2006.01)

(52) U.S. Cl. .................. 345/76; 345/82; 345/207; 345/690; 348/602; 348/800; 348/801; 315/169.1; 315/169.3; 315/169.4

(58) Field of Classification Search ............. 345/76, 345/81–83, 87, 90, 93, 98, 204–207, 211–214; 348/602, 800, 801; 315/169.1, 169.3, 169.4
See application file for complete search history.

(56) References Cited

U.S. PATENT DOCUMENTS

| | | | |
|---|---|---|---|
| 4,535,341 A | 8/1985 | Kun et al. | |
| 4,769,292 A | 9/1988 | Tang et al. | |
| 4,782,340 A | 11/1988 | Czubatyj et al. | |
| 5,061,569 A | 10/1991 | VanSlyke et al. | |
| 5,093,654 A | 3/1992 | Swift et al. | |
| 5,153,756 A | 10/1992 | Ike | |
| 5,157,525 A | 10/1992 | Eaton et al. | |
| 5,216,504 A | 6/1993 | Webb et al. | |
| 5,371,537 A | 12/1994 | Bohan et al. | |
| 5,396,257 A | 3/1995 | Someya et al. | |
| 5,406,305 A | 4/1995 | Shimomura et al. | |
| 5,776,623 A | 7/1998 | Hung et al. | |
| 5,783,909 A | 7/1998 | Hochstein | |
| 5,831,693 A | 11/1998 | McCartney, Jr. et al. | |
| 5,850,205 A | 12/1998 | Blouin | |
| 5,910,792 A | 6/1999 | Hansen et al. | |
| 5,917,464 A | 6/1999 | Stearns | |
| 5,929,845 A | 7/1999 | Wei et al. | |
| 6,069,676 A | 5/2000 | Yuyama | |
| 6,075,514 A | 6/2000 | Ryan | |
| 6,078,302 A | 6/2000 | Suzuki | |
| 6,191,764 B1 | 2/2001 | Kono et al. | |
| 6,208,091 B1 | 3/2001 | Beeteson et al. | |
| 6,271,825 B1 | 8/2001 | Greene et al. | |
| 6,320,325 B1 * | 11/2001 | Cok et al. ............. | 315/169.3 |
| 6,362,566 B1 | 3/2002 | Xu et al. | |
| 6,392,617 B1 * | 5/2002 | Gleason ............... | 345/82 |
| 6,542,138 B1 * | 4/2003 | Shannon et al. ....... | 345/76 |
| 6,720,942 B1 * | 4/2004 | Lee et al. .............. | 345/82 |

FOREIGN PATENT DOCUMENTS

| | | |
|---|---|---|
| EP | 0 923 067 | 6/1999 |
| JP | 08334746 | 12/1996 |
| WO | 94/10794 | 5/1994 |
| WO | 99/53472 | 10/1999 |

* cited by examiner

*Primary Examiner*—Henry N. Tran
(74) *Attorney, Agent, or Firm*—Andrew J. Anderson

(57) ABSTRACT

An image display, includes a substrate; a light emitter formed on the substrate; and a photo-sensor formed on the substrate and optically coupled directly to the light emitter.

46 Claims, 6 Drawing Sheets

FLAT-PANEL DISPLAY WITH LUMINANCE FEEDBACK

CROSS REFERENCE TO RELATED APPLICATIONS

This is a Continuation of application Ser. No. 09/675,346, filed Sep. 29, 2000 by Ronald S. Cok et al., entitled A FLAT-PANEL DISPLAY WITH LUMINANCE FEEDBACK.

FIELD OF THE INVENTION

The present invention relates to solid-state flat-panel display devices and more particularly to such display devices having means to optimize the luminance of each pixel in the display through the use of optical feedback information from each pixel.

BACKGROUND OF THE INVENTION

Solid-state organic light emitting diode (OLED) image display devices are of great interest as a superior flat-panel digital display device. These display devices utilize current passing through thin films of organic material to generate light. The color of light emitted and the efficiency of the energy conversion from current to light are determined by the composition of the organic thin-film material. Moreover, the display devices can be made with exclusively transparent materials supporting the integration of other optical devices above and below an OLED display device. U.S. Pat. No. 5,776,623 issued Jul. 7, 1998 to Hung et al., describes such a system.

OLED materials are also responsive to electromagnetic radiation and, when appropriately biased within an electrical circuit, can produce a current dependent on the ambient light. For example, U.S. Pat. No. 5,929,845 issued Jul. 27, 1999 to Wei et al., describes a system which both emits and detects light using an organic electro-luminescent apparatus. Although the transparent organic emissive materials may emit only a limited frequency range of light, other absorptive materials may be added to the OLED device structure to absorb a very broad spectrum and respond photo-electrically to the presence of light. Other devices and materials, such as silicon photodiodes are also photo-responsive to light.

The luminous efficiency of the OLED devices often decreases significantly with continuous operation due to the instability of the organic materials. This instability may be as a result of aging, temperature changes, humidity, or other environmental stresses. Luminous efficiency is defined as the ratio of luminous output in units of candelas per square meter to the electrical current passing through the OLED in amperes per square meter. Thus, a degradation of OLED luminous efficiency means that upon usage more and more current must pass through the OLED in order to achieve the same luminance.

Moreover, current control in a display device is problematic, especially as compared to voltage control, requiring more circuitry and thus increasing the complexity of the supporting electronics within the display.

Attempts have been made in the prior art to optimize particular display systems to overcome some of the problems noted above. For example, U.S. Pat. No. 5,216,504 issued Jun. 1, 1993 to Webb et al. describes a digital control device within a video monitor to calibrate or otherwise optimize the display, either with human input or under automated computer control.

Some systems integrate user-controlled control mechanisms to provide more flexible operation or optimal use under varying conditions. For example, brightness and contrast controls are often available on CRT and LCD display devices. These controls can be based on information from the device itself, using a reference pixel within the display. U.S. Pat. No. 5,157,525 issued Oct. 20, 1992 to Eaton et al. describes the use of a reference pixel with separate control to maintain a pre-selected value for contrast or absolute brightness using a feedback arrangement which includes an LCD reference element. The feedback information is determined by measuring the average transmissivity of the LCD material with a photo-detector. U.S. Pat. No. 5,910,792 issued Jun. 8, 1999 to Hansen et al. compares current passing through a resistive layer with that of a current source to provide a feedback compensation for temperature-induced brightness variation. One problem with these approaches is that the feedback does not directly respond to the emissivity of the pixels themselves, or address problems with different types (e.g. colors) of pixels within a display. It is also known to calibrate display devices through the use of external sensors which measure the light output from the display device and construct a calibration table for use by the device. See for example U.S. Pat. No. 5,371,537 issued Dec. 6, 1994 to Bohan et al. This approach has the problem that the sensor device obscures the display during the calibration and is not capable of providing real time operation.

There is a need therefore for an improved detection method for light emission and control for an emissive display.

SUMMARY OF THE INVENTION

The need is met according to the present invention by providing an image display that includes a substrate; a light emitter formed on the substrate; and a photo-sensor formed on the substrate and optically coupled directly to the light emitter.

Advantages

The advantages of this invention are an emissive digital image display device with improved performance. By integrating light detection capabilities together with feedback logic to control the operational characteristics of the emitters, improved lifetime, brightness, luminous uniformity, and power consumption can all be achieved.

DETAILED DESCRIPTION OF THE INVENTION

The present invention is a solid-state display device with addressable light emitting pixels that overcomes the problems in the prior art through the use of optical detector(s) integrated on the display and directly optically coupled with the light emitters of the display. The optical detector(s) produces current dependent on the light emitted from the light emitters. This current is then used as a feedback mechanism to control the current passed through the light emitting pixels to achieve the desired light output.

Figure 1:
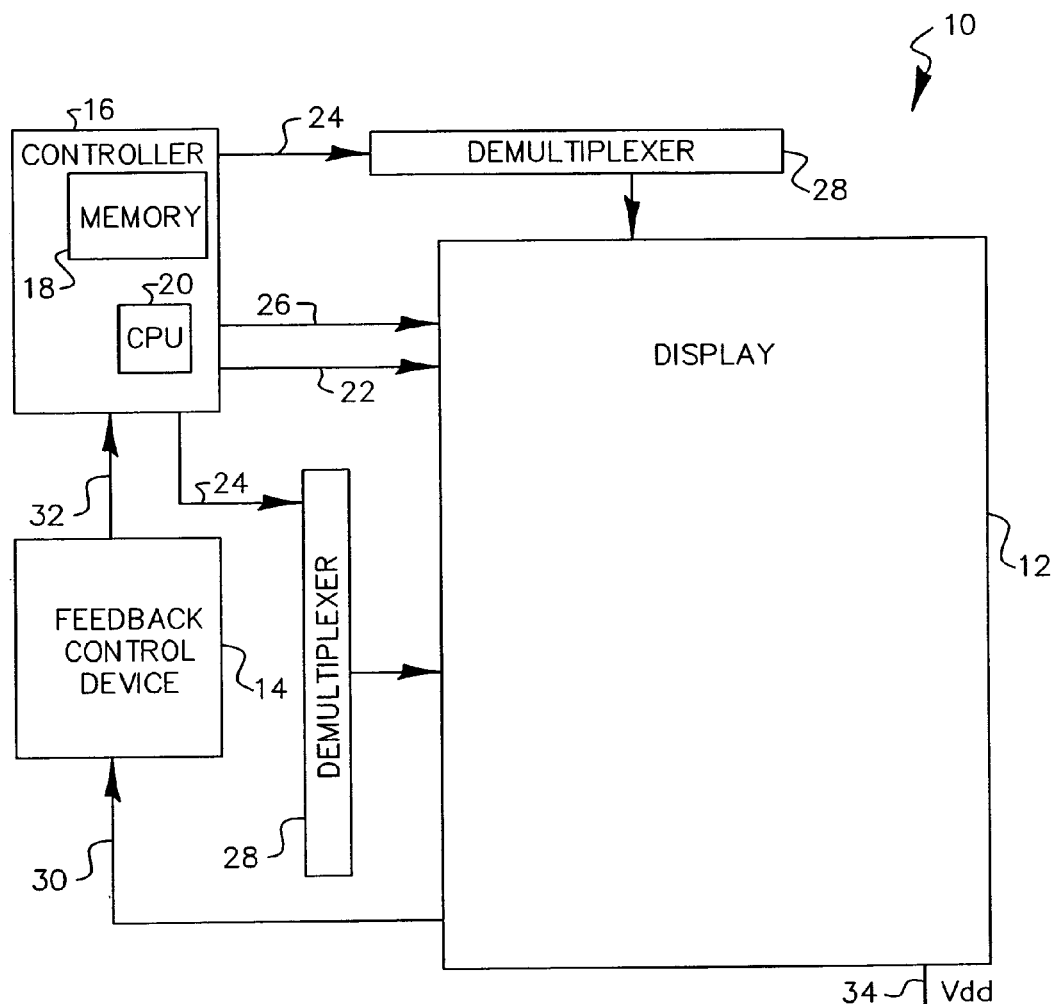
FIG. 1 is a schematic diagram of a display device with feedback and control circuits according to the present invention.
Figure 11:
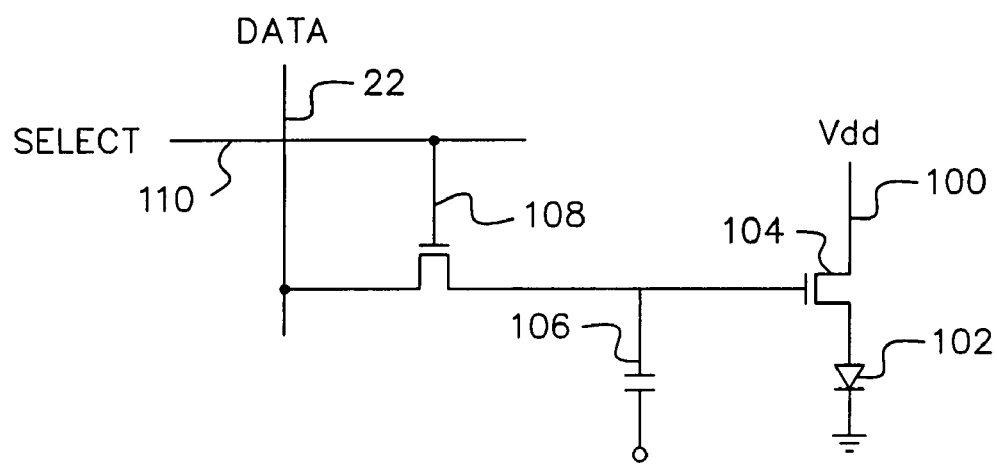
FIG. 11 is a circuit diagram of an emissive LED as in known in the prior art.

The apparatus operates as follows. A display system 10 in FIG. 1 includes a display 12 with a feedback control device 14 and a controller 16 which drives the display. The controller 16 can be an analog device or, as shown, a computer with a memory 18 for instructions and data and a central processing unit 20. The controller writes data to particular display elements using, data, address, and control signals, represented by signals 22, 24, and 26, respectively. The address lines are decoded with demultiplexers 28. A feedback signal 30 generated by the photo-sensor(s) within the display is passed to the feedback circuit 14, processed, and the resulting signal 32 passed to the controller. The light emitting pixels in the display are powered through line 34 and connected to the Vdd line 100 in FIG. 11. FIG. 11 illustrates a simple emissive LED circuit known in the art wherein a Vdd power line 100 supplies power to an LED 102 through drive transistor 104. The drive transistor 104 is responsive to charge stored in capacitor 106 that is deposited by transistor 108 in response to a signal on data and select lines 22 and 110 respectively. The signal on select line 110 is formed in the conventional manner from signals on address and control lines 24 and 26 respectively.

Figure 2:
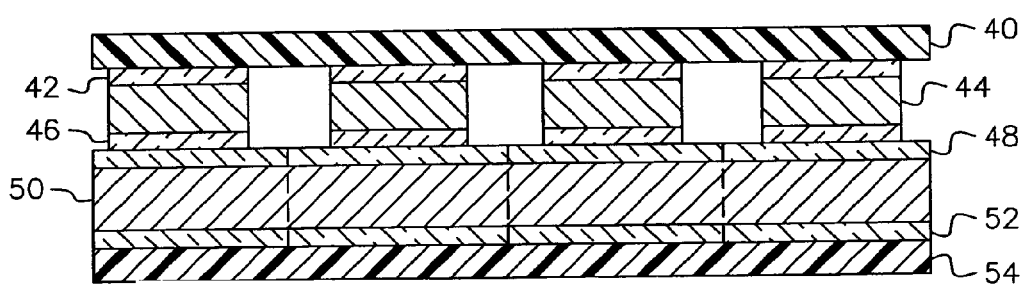
FIG. 2 is a cross sectional view of a preferred embodiment of the display device according to the present invention.
Figure 3:
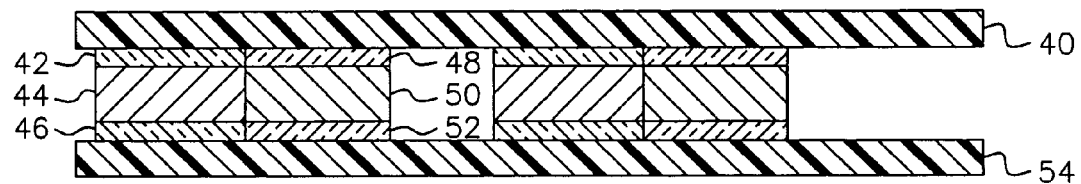
FIG. 3 is a cross sectional view of an alternative embodiment of the display device according to the present invention.
Figure 4:
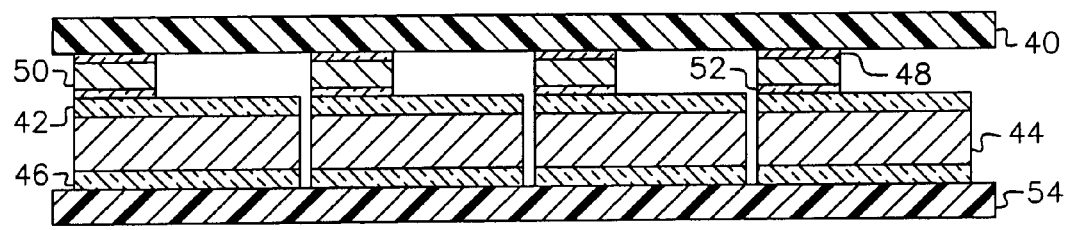
FIG. 4 is a cross sectional view of another alternative embodiment of the display device according to the present invention.

The photosensor(s) are implemented by placing optically coupled photo-responsive materials adjacent to a display device as shown in any of FIGS. 2, 3 or 4. In these figures, an emissive layer 44 is optically coupled to a photosensor layer 50. Each of these layers has electrodes on either side; 42 and 46 for the emissive layer and 48 and 52 for the photo-sensor layer. These elements are deposited upon a substrate 40 and encapsulated by a cover plate 54. The physical placement of the emissive layer with respect to the photo-sensor layer can vary depending on the manufacturing process, variety of materials, and circuit design. In FIG. 2, the emissive materials are shown between the photo-sensor materials 50 and the substrate 40. FIG. 3 illustrates the emissive layer 44 next to the photosensor layer 50. FIG. 4 illustrates the photo-sensor materials between the emissive layer 44 and the substrate 40 and, in this case, covering only a portion of the emissive layer. Either the substrate 40 or the cover 54 must be transparent to allow the light from the emissive layer to be viewed. For the same reason, any electrodes through which light must pass must also be transparent. Transparent electrodes can be made of indium tin oxide and are well known in the art. The layer 40 or 54 that is not transparent can be reflective to maximize the use of the light.

The light emitting material may actually be composed of more than one subsidiary layer, for example, a hole transport layer and an emissive layer; these are all represented as the single layer 44. As is well known in the art, the light emitting material is pixellated into separate light emitting areas and the electrodes are used to address the separate pixels by connecting rows and columns of pixels. The various electrodes are used to select the pixel and write information to it using input from signal lines 22, 24, and 26 in FIG. 1.

The photo-sensor material can likewise be composed of multiple layers. The electrodes 48 and 52 are used to provide the feedback signal 30 in FIG. 1. Note that, in FIG. 2, the photo-sensor material 50 and electrodes 48 and 52 are divided by dotted lines to represent a possible partition into separately addressable components. As will be seen, the present invention discloses an apparatus with a photo-sensor layer either held in common among pixels or separately.

In a preferred embodiment, the light emissive materials 44 are made of organic LED materials. Cover plate 54 can be, for example, enamel coated steel plate, plastic or glass. The photo-sensor materials 50 can be composed of semiconductor materials whose deposition and processing are compatible with the display elements, for example traditional crystalline silicon, poly-silicon, or amorphous silicon materials. Any other compatible photo-sensor materials may also be used, for example, the layer 50 can be composed of organic materials disposed between electrodes 48 and 52 so as to be responsive to light. Depending on the manufacturing process used, it may be preferable to construct the photo-sensor layers first. Moreover, an additional transparent electrically insulative layer, such as glass, may be desired between the electrodes 46 and 48 in FIG. 2 and electrodes 42 and 52 in FIG. 4. Alternatively, the two contiguous electrode layers may be combined into one layer, depending on the nature and polarity of the signals supplied to the emissive and photo-sensor layers. In any case, an integrated process simplifies the device fabrication and enhances the robustness of the complete device.

Figure 5:
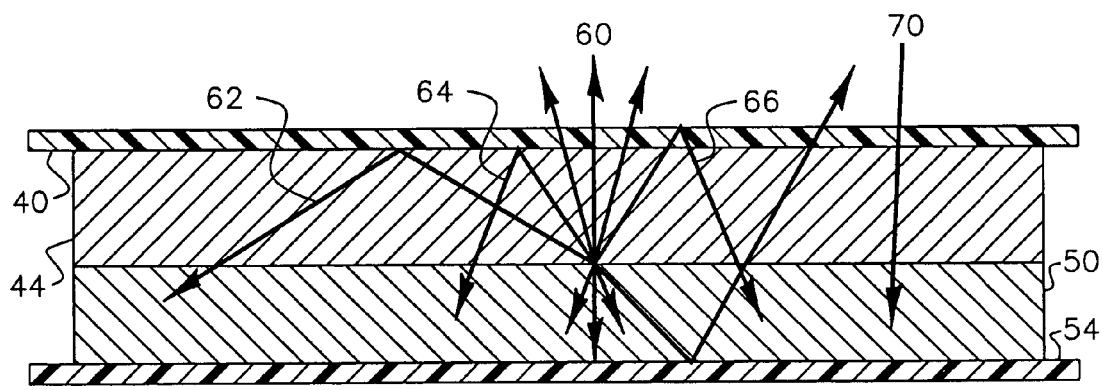
FIG. 5 is a schematic diagram illustrating the emission and absorption of light in a display device according to the present invention.

When activated and as shown in the simplified FIG. 5 corresponding to FIG. 2, the emissive materials 44 are. energized by the contacts 42 and 46. Some of the light 60 emitted from the emissive materials 44 is emitted; other light is directly absorbed by the photo-sensor material. Light may also reflect from the substrate 40 or cover 54 of the display, pass back through the emissive materials 44, and be absorbed by the photo-sensor materials 50. The resulting current is collected via the electrodes 48 and 52. The photo-sensor(s) are also optically coupled to the light emitters through total internal reflection (depending on the angle at which it was emitted as with light ray 62), or by reflection from the interface between the face plate and emission layer (as with light ray 64), or by reflection from the interface between the face plate and the air (as with light ray 66), or through any other optical coupling mechanism. The electrodes (not shown in FIG. 5) also serve as a mechanism for reflections.

Figure 6:
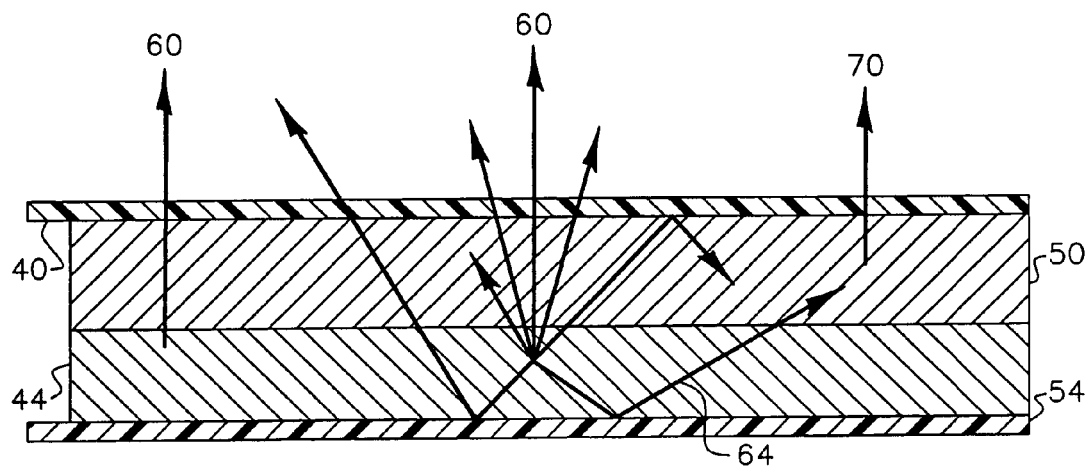
FIG. 6 is schematic diagram illustrating the emission and absorption of light in an alternative display device according to the present invention.

Ambient light 70 can also pass through the emissive layers, substrate, or cover into the photo-sensor material 50. The optically coupled light and ambient light is then absorbed by the photo-sensor material 50 and produces a current dependent on the luminance of the light detected. This current is the feedback signal 30 in FIG. 1. FIG. 6 illustrates a similar arrangement corresponding to FIG. 4. Note that in any case, the light might be emitted through either the substrate 40 or the cover 54 depending on which layer is transparent.

Each pixel in the display device is selected by address signals, as is well known in the art. Likewise, each photo-sensor element can be selected using either the same or different address signals. For example, conventional display devices, memory devices, or imaging devices such as CCDs all use similar techniques. The photo-sensor elements may be selected individually (as are the display pixel elements) or in groups. Groups of photo-sensor elements can be joined either physically or logically to provide a measure of incident light over larger areas thus reducing both the specificity of the information and the need for supporting logic and interconnects. (This is illustrated in FIG. 2 with dotted lines.) In the extreme case, the photo-sensor elements may be joined into one large element whose current represents the optically coupled light of the display device as a whole.

The current detected from the photo-sensor elements can be used to provide feedback from the light detected. Generally speaking, the current generated is compared to a priori knowledge of the current generated at the desired luminance (a reference). The current driving the display materials is then increased or decreased until the current from the photo-sensor layer matches the desired current. When this occurs, the light generated by the light emitters is at the desired level. Note that as the light emitters degrade over time, become less efficient, and emit less light, the resulting photo-electric current will decrease, causing an increase in driving current to compensate for the reduced light output.

Digital image display devices are generally used to emit light at various levels or brightness, typically 256 or 1024 levels (8-bits or 10-bits in a conventional binary digital computer system). Each level is associated with a particular amount of power needed to produce the corresponding brightness and a reference level can be generated for each display level, thus controlling very precisely the desired light output for each brightness level. These references can also compensate for any irregularities in the brightness/power curve for a particular emissive display material. The reference values can be obtained from various sources, from a model of emitter behavior, from measurements on an exemplary display, or from experience with similar displays in the past.

Different display materials are used to produce light of different colors and these different materials may have different efficiency and aging characteristics. Just as each brightness level can have an individual reference, each color can be likewise calibrated. In the case of a single feedback photosensor element, by simply energizing only one color at a time, a suitable reference value can be measured for each color. If implemented digitally, the color and brightness calibration are simply implemented using a 256 by 3 entry lookup table (for an 10-bit system with three colors), a technique very common in the art. If photo-sensor elements are associated with subgroups of pixels, a feedback correction mechanism (for example, a lookup table) must be associated with that subgroup.

There are at least two preferred mechanisms for providing the feedback control. In the first mechanism illustrated in FIG. 7, the feedback current 30 from the display is aggregated by the feedback circuit 14 into a single feedback signal 32. This signal is then compared by the controller 16 to a standard signal representing the desired luminance output of the display. The voltage of the Vdd signal 34 is then raised or lowered until the desired luminance and feedback current are reached. In this case, the signal 34 is managed by the control device 16 and may be controlled with an analog circuit such as a voltage controller 80.

Likewise, in the simplest case, the comparison may be done by an operational amplifier 82 which is set to either a fixed value representing the optimum operating voltage of an exemplary device or to some other value chosen by other criteria.

Figure 8:
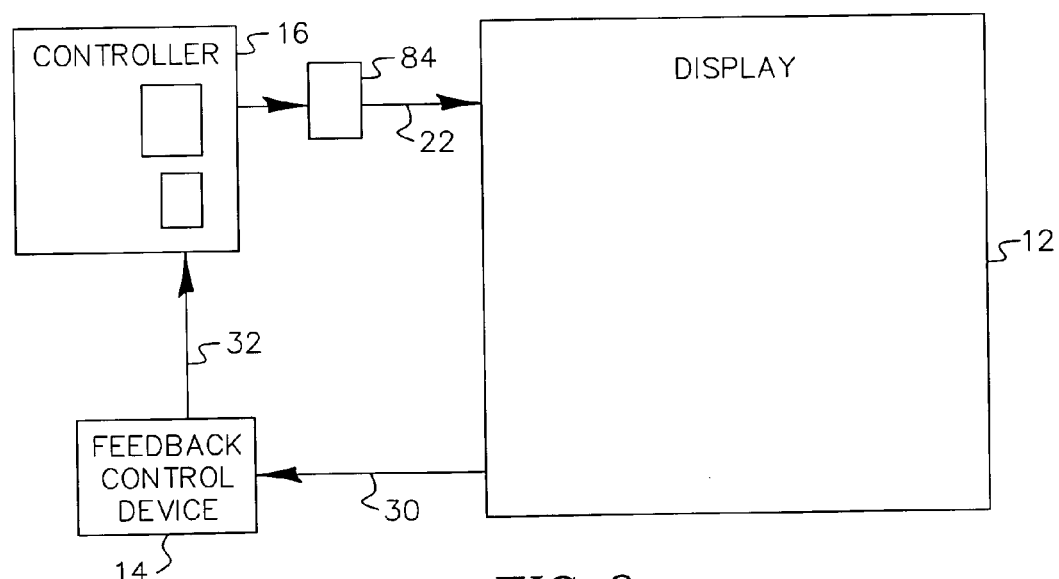
FIG. 8 is a schematic diagram of a display device with digital corrective circuitry according to the present invention.

The feedback signal can be aggregated in different ways. In the simplest case, a single value is produced for each brightness value representing the luminance of the display for each gray scale level it can emit. If this brightness matches the expected brightness of the display, no change is necessary. If, through aging materials or other reasons, the display does not emit the proper amount of light, the data values can be modified so as to induce the display to emit more light. Referring to FIG. 8, this modification can be accomplished through the use of a lookup table 84, a very well known technique.

The compensating signals should correspond to the pixel elements whose feedback they represent. If only one signal represents the output of the device as a whole, then every data value can be adjusted by a fixed amount. If a separate feedback value is obtained for each brightness level, then the data value corresponding to each brightness level can be adjusted. If a separate feedback value is obtained for each color, then each color can be adjusted by a fixed amount. These various data values can be combined in numerous ways depending on the feedback obtained. Moreover, feedback values can be obtained for pixels depending on their address within the display rather than brightness level only. Each pixel could thus have a separate table customizing its output. Note, however, that the size of these tables grows rapidly. If lookup tables are not desired, it is also possible to use equations modeling the desired behavior to compute the correction. This approach reduces memory requirements but may have a deleterious impact on performance speed. These lookup tables and computation methods are all well known in the art and are a standard part of many computer-controlled systems. In general, the feedback correction can be done either continuously or periodically, either while the device is in use or at a boot or setup time. The only requirement is that the feedback measurement must be taken while the device displays at a known brightness value.

Note that this invention makes it unnecessary to control the display materials through the use of current controllers and can instead drive the display through voltage control, thus simplifying the control electronics as well as compensating for possible changes in the display material efficiencies.

It is important to realize that the photo-sensor materials will be exposed to both optical coupling from the display and to ambient light. Proper compensation must be made for this situation. The simplest mechanism for properly distinguishing between ambient and display light is to first measure the ambient light current. This is done simply by applying zero current to the light emitting pixels so that the pixels emit no light. Any residual photo-electric current will be due to ambient radiation and any reference comparison must adjust for this residual current. This reference adjustment can be done at the time the display device is powered up or periodically while it is in use.

This reference adjustment can also be used to automatically compensate for changes in the ambient environment. When viewed in a dark environment (little ambient radiation), a display device need not be as bright as when viewed in a lighter environment (more ambient radiation). If the display device light output is recalibrated periodically, it will maintain a fixed difference between the ambient and displayed light even if the ambient light changes. This can, in turn, increase display device lifetime by reducing unnecessary display brightness in a dark environment and increase display device visibility in a bright environment. If brightness compensation is done on a pixel address basis, it is even possible to correct different parts of the display in different ways, correcting for devices that may be partly shaded, for example.

Figure 9:
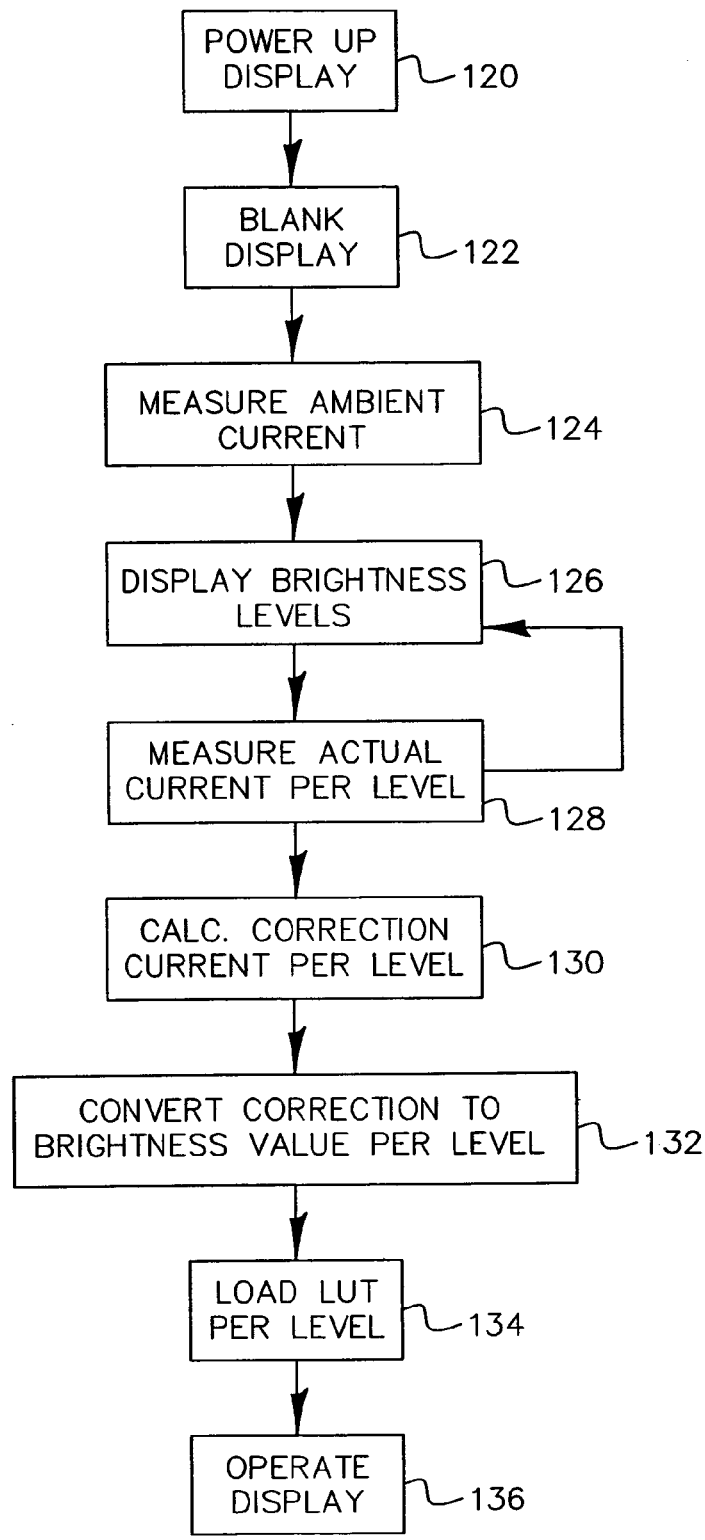
FIG. 9 is a flow chart illustrating the calculation of corrective values according to the present invention.

The flow chart in FIG. 9 illustrates a simple process for calculating the lookup table value for each brightness level. The device is first turned on 120 and set to display 122 a blank (black) image or screen. The feedback current is measured 124 and represents the ambient light. The display is then cycled through each brightness output level it can emit 126 and the feedback current measured for each level 128 (the actual current). This feedback current represents the sum of the ambient light and the emitted light for a given brightness level. The actual current value is then subtracted from the desired (reference) current corresponding to the desired light level plus the ambient current to obtain a correction current 130. This correction current is added to the reference current and the sum converted to a corresponding brightness level 132 and placed in the table 134 for the original brightness level measured. The display is then operated using the corrected brightness levels 136. If the ambient is zero and the actual equals the reference, the table value will equal the reference value, that is the table value is the ideal value and no correction is made (table output equals table input). The following equation describes the calculation where the function F represents the conversion from a current measurement to the corresponding brightness level i.

$$T_i = F(REFCURRENT_i + (REFCURRENT_i + AMBIENTCURRENT - ACTUALCURRENT_i))$$

This calculation can be done using the control circuit 16 and its components 18 and 20.

Figure 7:
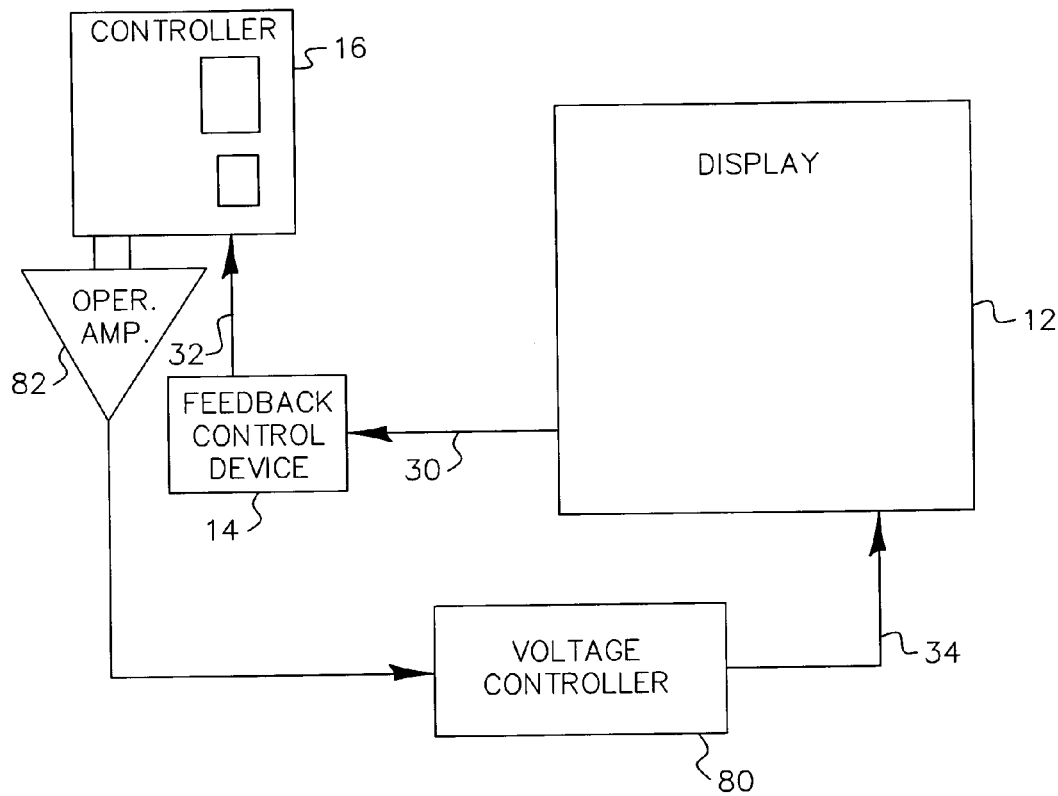
FIG. 7 is a schematic diagram of a display device with analog corrective circuitry according to the present invention.
Figure 10:
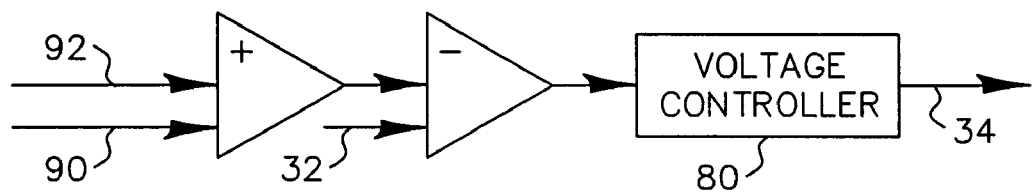
FIG. 10 is a schematic diagram for an analog circuit illustrating the calculation of corrective values according to the present invention.

In the case for which the voltage controller is used and a single feedback value is used, the entire correction calculation can be done using analog components (for example, operational amplifiers and a voltage controller as shown in FIG. 7). FIG. 10 illustrates this in more detail. The actual value 32 is subtracted from the sum of the ideal reference value 90 and ambient value 92 and used as a corrective input to the nominal voltage at which the voltage controller is set. These analog computing techniques and devices are all well known in the art. If compensation for ambient illumination is desired, the value must be first collected using the controller 16 as described above, and stored. Using either the digital or analog correction, the computation can also be done iteratively by making successive adjustments to the correction values. In this case, the actual measurements are taken with the existing correction values and a difference to the correction value computed and applied.

It is also possible to restrict the photo-sensor region beneath the display elements to only a subset of the pixels. This reduces the logical infrastructure needed to support the feedback but presumes that corrections for one part of the display are equally applicable to other parts.

The feedback circuitry can be integrated directly onto the same substrate as the display device or it can be implemented externally to the display. In general, higher performance and greater accuracy can be achieved by integrating the circuitry directly with the display device but this may not be desirable for all display devices. (For example, the pixel technology and manufacturing process may inhibit the integration of circuitry and logic.) The present invention can be applied to both active- and passive-matrix display devices.

Organic Light Emitting Diodes (OLEDs) including small molecule polymeric OLEDs as disclosed in but not limited to U.S. Pat. No. 4,769,292, issued Sep. 6, 1988 to Tang et al. and U.S. Pat. No. 5,061,569 issued Oct. 29, 1991 to VanSlyke et al., provide a technical platform on which a suitable display device can be created. Many combinations and variations of OLED materials would be apparent to those knowledgeable in the art and can be used to fabricate such a device and are included in this invention.

The present invention provides a highly integrated, small, and light weight means to provide optical feedback to emissive display devices. This feedback can lengthen the device lifetime, reduce power consumption, and provide flexibility in application.

The invention has been described in detail with particular reference to certain preferred embodiments thereof, but it will be understood that variations and modifications can be effected within the spirit and scope of the invention.

| PARTS LIST | |
|---|---|
| 10 | display system |
| 12 | display |
| 14 | feedback control device |
| 16 | controller |
| 18 | memory |
| 20 | central processing unit |
| 22 | data signal |
| 24 | address signal |
| 26 | control signal |
| 28 | demultiplexer |
| 30 | feedback signal |
| 32 | processed feedback signal |
| 34 | power line Vdd |
| 40 | substrate |
| 42 | electrode |
| 44 | light emissive layer |
| 46 | electrode |
| 48 | electrode |
| 50 | photosensor layer |
| 52 | electrode |
| 54 | cover plate |
| 60 | emitted light |
| 62 | totally internally reflected light |
| 64 | reflected light |
| 66 | reflected light ray |
| 70 | ambient light |
| 80 | voltage controller |
| 82 | operational amplifier |
| 84 | lookup table |
| 90 | ideal reference value |
| 92 | ambient value |
| 100 | VDD power line |
| 102 | LED |
| 104 | drive transistor |
| 106 | storage capacitor |
| 108 | transistor |
| 110 | select signal line |
| 120 | turn on device step |
| 122 | display blank step |
| 124 | measure ambient current step |
| 126 | display brightness level step |
| 128 | measure actual current step |
| 130 | calculate correction current step |
| 132 | convert to brightness step |
| 134 | load lookup table step |
| 136 | operate display step |

What is claimed is:

1. A light emitting image display, comprising:
 a) a substrate;
 b) an array of addressable light emitters formed on the substrate, the light emitters comprising a light emissive layer and electrode layers on either side of the light emissive layer which are deposited on the substrate;
 c) a drive circuit for driving the light emitters to emit light in an imagewise pattern;
 d) one or more photo-sensors formed on the substrate, the photo-sensor comprising a photo-sensor layer and electrode layers on either side of the photo-sensor layer which are deposited on the substrate, and the photo-sensor layer being directly optically coupled to the emissive layer of the light emitters in the array to detect light emitted by the light emitters and to generate a feedback signal in response thereto; and
 e) a feedback control circuit responsive to the feedback signal for controlling the drive circuit to control the desired light output for each brightness level of the display.

2. The image display claimed in claim 1 wherein the substrate is transparent and the light emitters emit light through the transparent substrate.

3. The image display claimed in claim 1 wherein a transparent cover encapsulates the image display and the light emitters emit light through the transparent cover.

4. The image display claimed in claim 1 wherein the photo-sensors are organic photo-conductors.

5. The image display claimed in claim 1 wherein the photo-sensors are made of silicon materials.

6. The image display claimed in claim 1 wherein the light emitters are organic light emitting diodes.

7. The image display claimed in claim 1 wherein the light emitters are optically transparent.

8. The image display claimed in claim 1 wherein the photo-sensors are optically transparent.

9. The image display claimed in claim 1 wherein the array of light emitters and the one or more photo-sensors are arranged adjacent to each other on the substrate.

10. The image display claimed in claim 1 wherein the light emitters are disposed between one or more photo-sensors and the substrate.

11. The image display claimed in claim 1 wherein one or more photo-sensors are disposed between the light emitters and the substrate.

12. The image display claimed in claim 1 wherein the one or more photo-sensors are separated from the light emitters by an optically transparent material.

13. The image display claimed in claim 12 wherein the optically transparent material is electrically insulating.

14. The image display claimed in claim 12 wherein the optically transparent material is electrically conductive.

15. The image display claimed in claim 1 wherein the feedback control circuit compares the feedback signal to a reference signal to produce a modified signal value that is supplied to the drive circuit to modify the output of the light emitters.

16. The image display claimed in claim 15 wherein a separate reference signal is used for each of the different brightness levels produced by the light emitter.

17. The image display claimed in claim 15 wherein the light emitters include emitters that emit different colors of light and wherein a separate reference signal is used for each of the different colored light emitters.

18. The image display claimed in claim 15 wherein the feedback control circuit generates a single feedback signal and wherein the drive circuit modifies a voltage used to power the light emitters in response to the feedback signal.

19. The image display claimed in claim 15 wherein the feedback control circuit generates a separate feedback control signal for each light emitter.

20. The image display claimed in claim 15 wherein the feedback control circuit is integrated on the substrate.

21. The image display claimed in claim 15 wherein the drive control circuit includes a lookup table containing the modified signal values.

22. The image display claimed in claim 21 wherein the light emitters include emitters that emit different colors of light and wherein the drive control circuit contains a lookup table for each of the colors.

23. The image display claimed in claim 21 wherein the light emitters include emitters that emit different brightnesses and wherein the lookup table contains a signal value for each of the brightnesses.

24. The image display claimed in claim 21 wherein the drive control circuit further comprises means for periodically updating the lookup table.

25. The image display claimed in claim 21 wherein the feedback control circuit modifies the signal values in the lookup table.

26. The image display claimed in claim 15 wherein the display further comprises means for compensating for ambient light that reaches the photosensor(s).

27. The image display claimed in claim 1 wherein the display includes a single photosensor that detects light emitted by any of the light emitters.

28. The image display claimed in claim 1 wherein the display includes a plurality of photo-sensors each of which is arranged to detect light emitted by a separate group of light emitters.

29. The image display claimed in claim 1 wherein the display includes one photo-sensor for each light emitter arranged to detect light from the light emitter.

30. The image display claimed in claim 1 wherein a cover encapsulates the image display, one of the substrate or the cover is transparent to allow light from the emissive layer to be viewed, and the other of the substrate or the cover is reflective.

31. The image display claimed in claim 1 wherein:
 a) the light emitters comprise, in order:
  i) an electrode layer on the substrate;
  ii) an electro-luminescent layer; and
  iii) a second electrode layer;
 and
 b) wherein the photo-sensor comprises, in order:
  i) a photo-sensor layer; and
  ii) a third electrically conductive layer.

32. The image display claimed in claim 31 further comprising a fourth electrode layer between the second layer and the photo-sensor layer.

33. The image display claimed in claim 32 further comprising an electrically insulating layer located between the second and the fourth electrode layers.

34. The image display claimed in claim 31 wherein any of the electrode layers are optically transparent.

35. The image display claimed in claim 1 wherein:
 a) the photo-sensor comprises, in order:
  i) a first electrode layer on the substrate;
  ii) a photo-sensor layer; and
  iii) a second electrically conductive layer;
 and wherein
 b) the light emitters comprise, in order:
  i) an electro-luminescent layer; and
  ii) a third electrode layer.

36. The image display claimed in claim 35 further comprising a fourth electrode layer between the second layer and the electro-luminescent layer.

37. The image display claimed in claim 36 further comprising an electrically insulating layer located between the second and the fourth electrode layers.

38. The image display claimed in claim 35 wherein any of the electrode layers are optically transparent.

39. The image display claimed in claim 1 wherein the display is an active matrix display.

40. The image display claimed in claim 1 wherein the display is a passive matrix display.

41. The image display claimed in claim 1 wherein the feedback control circuit compares the feedback signal to a model of light emitter behavior.

42. The image display claimed in claim 1 wherein the feedback control circuit compares the feedback signal to empirical data relating to the performance of an exemplary display.

43. The image display claimed in claim 1 wherein the feedback control circuit compares the feedback signal to historical light emitter attribute data.

44. The image display claimed in claim 1 wherein the display includes a plurality of photo-sensors each of which is individually addressable.

45. The image display claimed in claim 1, wherein the feedback signal represents the aggregate response of a plurality of photo-sensors.

46. The image display claimed in claim 1, wherein the display is a color display having differently colored light emitters, separate photo-sensors generate feedback signals for each color, and the feedback control circuit controls the desired light output for each color of the display.

* * * * *